(12) United States Patent
Sung et al.

(10) Patent No.: US 8,051,339 B2
(45) Date of Patent: Nov. 1, 2011

(54) DATA PRESERVING METHOD AND DATA ACCESSING METHOD FOR NON-VOLATILE MEMORY

(75) Inventors: Ming-Hsun Sung, Hsinchu (TW); Yu-Lin Hsieh, Tainan (TW)

(73) Assignee: ITE Tech. Inc., Hsinchu (TW)

( * ) Notice: Subject to any disclaimer, the term of this patent is extended or adjusted under 35 U.S.C. 154(b) by 960 days.

(21) Appl. No.: 12/015,484

(22) Filed: Jan. 16, 2008

(65) Prior Publication Data

US 2009/0125764 A1    May 14, 2009

(30) Foreign Application Priority Data

Nov. 13, 2007    (TW) .............................. 96142823 A

(51) Int. Cl.
*G11C 29/00*    (2006.01)

(52) U.S. Cl. ........................ 714/710; 714/758; 714/764

(58) Field of Classification Search .................. 711/159; 714/718, 733, 710, 758, 764
See application file for complete search history.

(56) References Cited

U.S. PATENT DOCUMENTS

| 7,177,977 | B2   | 2/2007  | Chen et al.              |
|-----------|------|---------|--------------------------|
| 7,313,721 | B2 * | 12/2007 | Ashmore ........... 714/6.32 |
| 7,412,575 | B2 * | 8/2008  | Park et al. ........... 711/159 |
| 7,447,936 | B2 * | 11/2008 | Shiota et al. ........ 714/6.1 |
| 7,523,381 | B2 * | 4/2009  | Eggleston et al. ...... 714/773 |

* cited by examiner

*Primary Examiner* — David Ton
(74) *Attorney, Agent, or Firm* — Jianq Chyun IP Office

(57) ABSTRACT

A data preserving method and a data accessing method for a non-volatile memory are provided. In the data preserving method, a data is checked according to an error correcting code (ECC) to obtain an error bit number of the data. When the error bit number is greater than a threshold, the data is moved from a first memory unit to a second memory unit and is corrected according to the ECC. Thereby, the data stability of the non-volatile memory is improved.

15 Claims, 2 Drawing Sheets

DATA PRESERVING METHOD AND DATA ACCESSING METHOD FOR NON-VOLATILE MEMORY

CROSS-REFERENCE TO RELATED APPLICATION

This application claims the priority benefit of Taiwan application serial no. 96142823, filed on Nov. 13, 2007. The entirety of the above-mentioned patent application is hereby incorporated by reference herein and made a part of this specification.

BACKGROUND OF THE INVENTION

1. Field of the Invention

The present invention generally relates to a non-volatile memory, in particular, to a data preserving method and a data accessing method for a non-volatile memory.

2. Description of Related Art

Generally speaking, non-volatile memories (for example, a flash memory) are always faced with the problem of data instability caused by, for example, bad blocks, write disturb, and read disturb. The problem of read disturb will be explained in detail below.

FIG. 1 is a diagram of memory units in a non-volatile memory. Referring to FIG. 1, read disturb is produced because of the physical characteristic of the non-volatile memory. The address lines 101$a$, 102$a$, 101$b$, 102$b$, 103$b$ . . . are used for transmitting data voltages or for addressing a data. In other words, if a data in memory unit 101 is to be read, the data in the memory unit 101 is addressed and read through the address lines 101$a$ and 101$b$, and accordingly a residual voltage is left on the address lines 101$a$ and 101$b$. Since the address line 101$a$ is shared by the memory units 101, 102, and 103, the residual voltage on the address line 101$a$ may affect the data in the memory units 102 and 103 and may even cause errors to the data in the memory units 102 and 103. Similarly, since the address line 101$b$ is shared by the memory units 101 and 104, the residual voltage on the address line 101$b$ may also affect the data in the memory unit 104 and may even cause error to the data in the memory unit 104.

SUMMARY OF THE INVENTION

Accordingly, the present invention is directed to a data preserving method for a non-volatile memory, wherein the data stability of the non-volatile memory is improved.

The present invention is directed to a data accessing method for a non-volatile memory, wherein the data validity of the non-volatile memory is improved.

The present invention provides a data preserving method for a non-volatile memory. In the data preserving method, a data is checked according to an error correcting code (ECC) to obtain an error bit number of the data. In addition, when the error bit number is greater than a threshold, the data is moved from a first memory unit to a second memory unit and is corrected according to the ECC.

According to an embodiment of the present invention, the step of checking the data according to the ECC to obtain the error bit number further includes reading the data according to a read address. According to another embodiment of the present invention, the second memory unit is a blank memory unit before the data is moved from the first memory unit to the second memory unit. According to yet another embodiment of the present invention, the first memory unit is erased or marked as a high risk memory unit after the data is moved from the first memory unit to the second memory unit. According to still another embodiment of the present invention, the threshold is smaller than a tolerable error number of the ECC. According to yet still another embodiment of the present invention, the first memory unit and the second memory unit are blocks or pages.

The present invention also provides a data accessing method for a non-volatile memory. In the data accessing method, an ECC is generated according to a data, and the data and the ECC are written into a first memory unit of the non-volatile memory. When the data is read, the data is checked according to the ECC to obtain an error bit number of the data. In addition, when the error bit number is greater than a threshold, the data is moved from the first memory unit to a second memory unit and is corrected according to the ECC.

According to an embodiment of the present invention, the step of writing the data and the ECC into the first memory unit further includes writing the data into a data storage area of the first memory unit according to a write address and writing the ECC into a spare area of the first memory unit according to the write address.

In the present invention, a data in a non-volatile memory is checked according to an ECC so as to obtain an error bit number, and when the error bit number is greater than a threshold, the data is moved from a first memory unit to a second memory unit and is corrected according to the ECC. Thereby, the data stability of the non-volatile memory is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
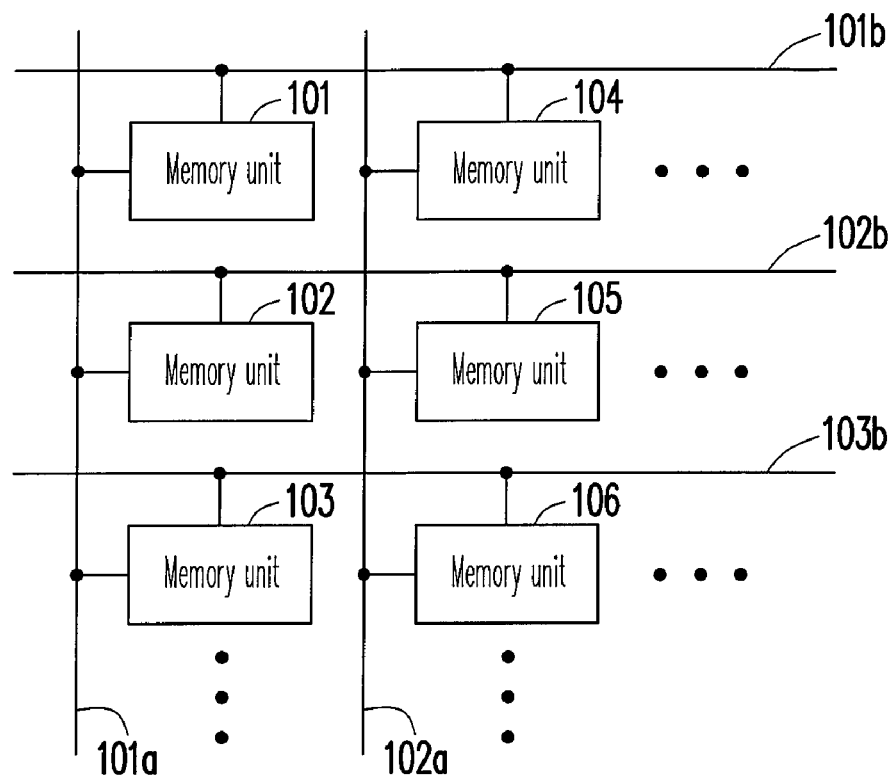
FIG. 1 is a diagram of memory units in a non-volatile memory.

Reference will now be made in detail to the present preferred embodiments of the invention, examples of which are illustrated in the accompanying drawings. Wherever possible, the same reference numbers are used in the drawings and the description to refer to the same or like parts.

Conventionally, a non-volatile memory is always faced with the problem of read disturb, and which may cause error to data stored in the non-volatile memory. Generally speaking, the bit error number of a data increases along with the number of times the data is read.

Accordingly, in embodiments of the present invention, the data in a memory unit of a non-volatile memory is checked according to an error correcting code (ECC) so as to monitor the error bit number of the data. When the error bit number is greater than a threshold, the data is moved to another memory unit and is corrected according to the ECC. Accordingly, the data can be programmed again and errors produced in the data can be corrected.

Figure 2:
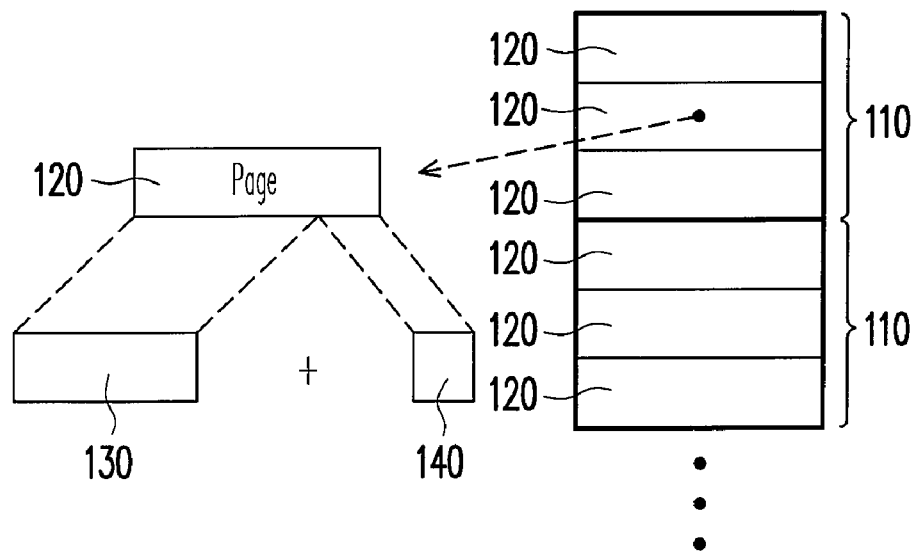
FIG. 2 is a block diagram of a NAND flash memory according to an embodiment of the present invention.

FIG. 2 is a block diagram of a NAND flash memory according to an embodiment of the present invention. Referring to FIG. 2, in the present embodiment, a NAND flash memory is described as an example of the non-volatile memory. Generally speaking, a NAND flash memory has a plurality of blocks 110, each of the blocks 110 includes a plurality of pages 120, and each of the pages 120 is further divided into a data storage area 130 and a spare area 140, wherein the data storage area 130 is used for storing data, and the spare area 140 is used for storing an ECC.

As described above, an ECC is used for correcting the errors produced in a data. It should be noted that different types of ECCs have different error tolerances. In the present embodiment, it is assumed that the tolerable error bits number of the ECC is 8. Once the error bits in the data exceed 8 bits, the ECC will not be able to correct these errors and may even increase the number of errors in the data.

Figure 3:
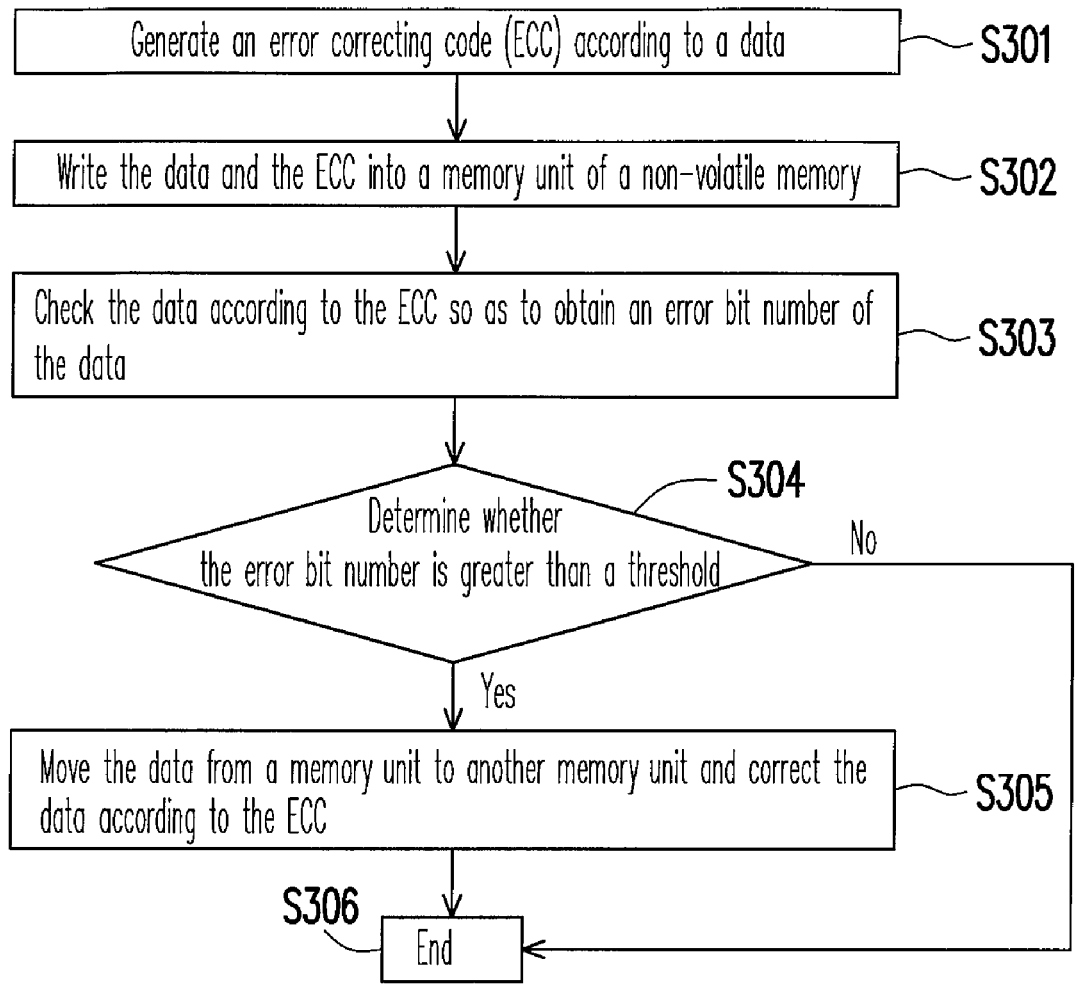
FIG. 3 is a flowchart of a data accessing method and a data preserving method according to an embodiment of the present invention.

FIG. 3 is a flowchart of a data accessing method and a data preserving method according to an embodiment of the present invention. The present embodiment is described with reference to the example illustrated in FIG. 1 so please refer to FIG. 1, FIG. 2, and FIG. 3 for following description. In the present disclosure, a memory unit may refer to a storage space of any unit. To be specific, a memory unit may be a block 110, a page 120, or a sector. In the present embodiment, the memory units 101~106 are assumed to be different blocks 110; however, the present invention is not limited thereto, and in another embodiment of the present invention, the memory units 101~106 may also be different pages 120 or different sectors. Additionally, the data preserving method in the present embodiment includes steps S303 and S304, and the data accessing method includes steps S301~S306. Below, various steps in the data accessing method for storing a data will be described in detail.

In the present embodiment, it is assumed that a first data is to be stored in a non-volatile memory. First, in step S301, a memory controller (not shown) generates an ECC according to the first data. Next, in step S302, the memory controller writes the first data and the ECC into the non-volatile memory according to a write address. In the present embodiment, assuming the write address is memory unit 101, the memory controller writes the first data into the data storage area 130 of the memory unit 101 and the ECC corresponding to the first data into the spare area 140 of the memory unit 101. By now the data writing operation is completed. Other data may be written into the non-volatile memory in similar process and which will not be described herein.

Along with the increase in the number of times the data stored in the non-volatile memory is read, errors may be caused to the data due to problems such as read disturb. Thus, data stored in the non-volatile memory should be appropriately preserved by using an ECC.

For example, step S303 can be executed whenever a data is read from the non-volatile memory. To be specific, when the memory controller is about to read the first data from the non-volatile memory, the memory controller searches for the first data and the corresponding ECC according to a read address. Next, the memory controller checks the first data stored in the data storage area 130 of the memory unit 101 according to the ECC stored in the spare area 140 of the memory unit 101 to obtain an error bit number of the data.

Here it is assumed that the error bit number of the first data is 6 and the threshold is 3. Next, in step S304, whether the error bit number is greater than the threshold is determined. If the error bit number is greater than the threshold, which means the first data is in a high risk state, step S305 is executed to correct the first data; otherwise, if the error bit number is smaller than the threshold, which means the first data is in a safe state and has low possibility of being damaged, step S306 is executed to end the data preserving operation. It should be mentioned that even though the threshold is assumed to be 3 in the present embodiment, the present invention is not limited thereto, and those skilled in the art should be able to set the threshold according to the actual requirement. The advantage of foregoing method is that the memory controller does not have to correct the data in a memory unit whenever an error is found. Accordingly, time for correcting errors is considerably reduced and the access speed to the non-volatile memory is not affected.

As described above, in the present embodiment, the error bit number 6 is greater than the threshold 3 preset by the system. Thus, step S305 is executed to move the first data from the memory unit 101 to another blank memory unit and to correct the first data. To be specific, if the memory unit 102 is a blank memory unit, the first data is moved from the memory unit 101 to the memory unit 102, and the first data is corrected according to the ECC. Thereby, errors in the first data can be corrected before the error bit number of the data exceeds the error tolerance of the ECC, so that the correctness of the first data can be ensured. In addition, the first data can be programmed again so that the first data will not be damaged for being in the high risk state for long time.

Most data errors are caused by current leakage, and current leakage is usually caused by defect in devices or physical structure of the non-volatile memory. A user cannot fix the problem of current leakage. A memory unit can be presumed to be a defective memory unit if a certain number of errors are caused to the data in the memory unit. Generally speaking, a defective memory unit is more likely to have errors occur to the data stored therein again than a normal memory unit.

Accordingly, the memory controller may also determine whether to mark the memory unit 101 as a high risk memory unit according to the error bit number of the data stored therein while executing foregoing step S305. For example, when the error bit number of the data in the memory unit 101 is between 6 and 7, step S305 is executed and the memory unit 101 is marked as a high risk memory unit, and when the error bit number of the data in the memory unit 101 is between 3 and 5, step S305 is executed and the memory unit 101 is erased. When a data is to be stored into the non-volatile memory later on, the memory controller can select a memory unit which is not marked as a "high risk memory unit" to store the data, so that the possibility of the data being damaged is reduced and data stability of the non-volatile memory is improved.

Foregoing situation that the error bit number falls between 6 and 7 or between 3 and 5 is not intended to limit the present invention, and those skilled in the art can set the range of the error bit number according to the actual requirement.

In summary, in the data preserving method for a non-volatile memory provided by the present invention, the data stability of the non-volatile memory can be improved and the data correctness thereof can be ensured without changing the structure of the non-volatile memory. Moreover, if the data preserving method is integrated with a data accessing method for the non-volatile memory, not only the functions described above can be achieved, but the data stored in the non-volatile memory can be maintained appropriately so that the data can be corrected before the error bit number of the data exceeds the error tolerance of an ECC. Furthermore, the methods provided by the present invention also have following advantages:

1. by setting a threshold, whether a data is corrected can be determined by checking whether an error bit number of the data is greater than the threshold. The data is corrected only when the error bit number is greater than the threshold so that it is not necessary to correct the data whenever an error occurs to the data. Accordingly, the access speed of the non-volatile memory is not affected.

2. a memory unit can be marked as a high risk memory unit when a certain number of errors are caused in the data stored in the memory unit. When a data is to be stored into the non-volatile memory later on, a memory unit which is not marked as a "high risk memory unit" can be selected to store the data so that the data stability of the non-volatile memory can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data preserving method for a non-volatile memory, comprising:
    checking a data according to an error correcting code (ECC) to obtain an error bit number of the data; and
    moving the data from a first memory unit to a second memory unit and correcting the data according to the ECC when the error bit number is greater than a threshold.

2. The data preserving method according to claim 1, wherein the step of checking the data according to the ECC to obtain the error bit number further comprises:
    reading the data according to a read address.

3. The data preserving method according to claim 1, wherein the second memory unit is a blank memory unit before the data is moved from the first memory unit to the second memory unit.

4. The data preserving method according to claim 1, wherein after the data is moved from the first memory unit to the second memory unit, the data preserving method further comprises:
    erasing the first memory unit.

5. The data preserving method according to claim 1, wherein after the data is moved from the first memory unit to the second memory unit, the data preserving method further comprises:
    marking the first memory unit as a high risk memory unit.

6. The data preserving method according to claim 1, wherein the threshold is smaller than the tolerable error number of the ECC.

7. The data preserving method according to claim 1, wherein the first memory unit and the second memory unit are blocks or pages.

8. A data accessing method for a non-volatile memory, comprising:
    generating an ECC according to a data;
    writing the data and the ECC into a first memory unit of the non-volatile memory;
    checking the data according to the ECC while reading the data so as to obtain an error bit number of the data; and
    moving the data from the first memory unit to a second memory unit and correcting the data according to the ECC when the error bit number is greater than a threshold.

9. The data accessing method according to claim 8, wherein the step of writing the data and the ECC into the first memory unit further comprises:
    writing the data into a data storage area of the first memory unit according to a write address; and
    writing the ECC into a spare area of the first memory unit according to the write address.

10. The data accessing method according to claim 8, wherein the step of checking the data according to the ECC while reading the data in order to obtain the error bit number further comprises:
    searching for the data and the ECC according to a read address.

11. The data accessing method according to claim 8, wherein the second memory unit is a blank memory unit before the data is moved from the first memory unit to the second memory unit.

12. The data accessing method according to claim 8, wherein after the data is moved from the first memory unit to the second memory unit, the data accessing method further comprises:
    erasing the first memory unit.

13. The data accessing method according to claim 8, wherein after the data is moved from the first memory unit to the second memory unit, the data accessing method further comprises:
    marking the first memory unit as a high risk memory unit.

14. The data accessing method according to claim 8, wherein the threshold is smaller than the tolerable error number of the ECC.

15. The data accessing method according to claim 8, wherein the first memory unit and the second memory unit are blocks or pages.

* * * * *